(12) United States Patent  
Abatake

(10) Patent No.: US 8,415,234 B2  
(45) Date of Patent: Apr. 9, 2013

(54) WAFER DIVIDING METHOD

(75) Inventor: Jun Abatake, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/462,229

(22) Filed: May 2, 2012

(65) Prior Publication Data

US 2012/0289028 A1    Nov. 15, 2012

(30) Foreign Application Priority Data

May 12, 2011    (JP) ................................. 2011-107207

(51) Int. Cl.
*H01L 21/00*    (2006.01)

(52) U.S. Cl.
USPC .......................................... 438/463; 438/460

(58) Field of Classification Search .................. None
See application file for complete search history.

(56) References Cited

U.S. PATENT DOCUMENTS

| | | | |
|---|---|---|---|
| 2006/0216911 A1* | 9/2006 | Yoshikawa et al. | 438/460 |
| 2008/0213977 A1* | 9/2008 | Wyant | 438/460 |
| 2008/0233712 A1* | 9/2008 | Sekiya | 438/462 |
| 2009/0298264 A1* | 12/2009 | Arai et al. | 438/464 |
| 2011/0136322 A1* | 6/2011 | Sato et al. | 438/464 |

FOREIGN PATENT DOCUMENTS

| | | |
|---|---|---|
| JP | 2005-129607 | 5/2005 |
| JP | 2007-189057 | 7/2007 |

* cited by examiner

*Primary Examiner* — Charles Garber  
*Assistant Examiner* — Brigitte Paterson  
(74) *Attorney, Agent, or Firm* — Greer, Burns & Crain, Ltd.

(57) ABSTRACT

A wafer dividing method including a step of applying a laser beam to a wafer along division lines with the focal point of the laser beam set inside the wafer, thereby forming modified layers inside the wafer along the division lines; a step of attaching an adhesive tape to the wafer, the adhesive tape having a base sheet and an adhesive layer; a dividing step of applying an external force to the wafer by expanding the adhesive tape, thereby dividing the wafer along the division lines to obtain a plurality of device chips; and a debris catching step of heating the adhesive tape to thereby soften the adhesive layer such that it enters the space between any adjacent ones of the device chips obtained by the dividing step, thereby catching debris generated on the side surface of each device chip in the dividing step to the adhesive layer by adhesion.

2 Claims, 8 Drawing Sheets

WAFER DIVIDING METHOD

BACKGROUND OF THE INVENTION

1. Field of the Invention

The present invention relates to a wafer dividing method including the steps of applying a laser beam having a transmission wavelength to a wafer to thereby form modified layers inside the wafer and next applying an external force to the wafer to thereby divide the wafer into device chips.

2. Description of the Related Art

In a semiconductor device fabrication process, a plurality of crossing division lines are formed on the front side of a semiconductor wafer to thereby partition a plurality of regions where devices are respectively formed. The semiconductor wafer is cut along the division lines to thereby divide the regions where the devices are formed from each other, thus obtaining individual device chips. Conventionally, cutting of the semiconductor wafer is performed by using a cutting apparatus called a dicing saw. However, it is difficult for the dicing saw to cut an optical device wafer having a crystal growth substrate formed of a hard brittle material such as sapphire and SiC. In recent years, therefore, attention has been paid to a technique of using a laser processing apparatus in dividing a wafer into a plurality of devices.

As a laser processing method using the laser processing apparatus, there is disclosed in Japanese Patent Laid-open No. 2005-129607, for example, a technique including the steps of applying a laser beam having a transmission wavelength to the wafer along the division lines to thereby form modified layers (brittle layers) inside the wafer along the division lines and next applying an external force to the wafer along the modified layers having a reduced strength by using an expanding apparatus or the like, thereby dividing the wafer into a plurality of device chips along the modified layers. This laser processing method can eliminate the generation of cutting debris in cutting a wafer by using a cutting apparatus. Further, the space for cutting (laser processing) is very small in this laser processing method, so that the width of each division line can be reduced.

SUMMARY OF THE INVENTION

However, in the above laser processing method including the steps of applying a laser beam having a transmission wavelength to the wafer to thereby form the modified layers inside the wafer and next applying an external force to the wafer to thereby divide (break) the wafer along the modified layers, there is a problem such that breaking debris are generated on the side surface of each device chip obtained by breaking. When the breaking debris are deposited to the front side of each device, the quality of each device may be degraded and there is a possibility of trouble in the subsequent steps including bonding and packaging.

It is therefore an object of the present invention to provide a wafer dividing method which can prevent a degradation in quality of each device due to the generation of breaking debris in dividing the wafer and can also eliminate the possibility of trouble in the subsequent steps.

In accordance with an aspect of the present invention, there is provided a wafer dividing method for dividing a wafer along a plurality of crossing division lines to obtain a plurality of device chips, the division lines being formed on the front side of the wafer to thereby partition a plurality of regions where a plurality of devices are respectively formed, the wafer dividing method including a laser beam applying step of applying a laser beam having a transmission wavelength to the wafer along the division lines in the condition where the focal point of the laser beam is set inside the wafer, thereby forming a plurality of modified layers inside the wafer along the division lines; an adhesive tape attaching step of attaching an adhesive tape to the wafer before or after performing the laser beam applying step, the adhesive tape having a base sheet and an adhesive layer formed on the base sheet, the adhesive layer being softened by heating; a dividing step of applying an external force to the wafer by expanding the adhesive tape after performing the laser beam applying step and the adhesive tape attaching step, thereby dividing the wafer along the division lines to obtain the plurality of device chips; and a debris catching step of heating the adhesive tape to thereby soften the adhesive layer of the adhesive tape and make the softened adhesive layer enter the space between any adjacent ones of the device chips obtained by the dividing step, thereby catching debris generated in the dividing step to the adhesive layer by adhesion.

According to the present invention, the adhesive tape having the adhesive layer capable of being softened by heating is attached to the wafer, and the adhesive tape is next expanded to divide the wafer. Simultaneously with or after this dividing step, the adhesive tape is heated to make the softened adhesive layer enter the space between the adjacent device chips, so that the debris generated on the side surface of each device chip can be caught by the adhesive layer by adhesion. Accordingly, the deposition of the debris to the front side of each device can be prevented to thereby prevent degradation in quality of each device and eliminate the possibility of trouble in the subsequent steps.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
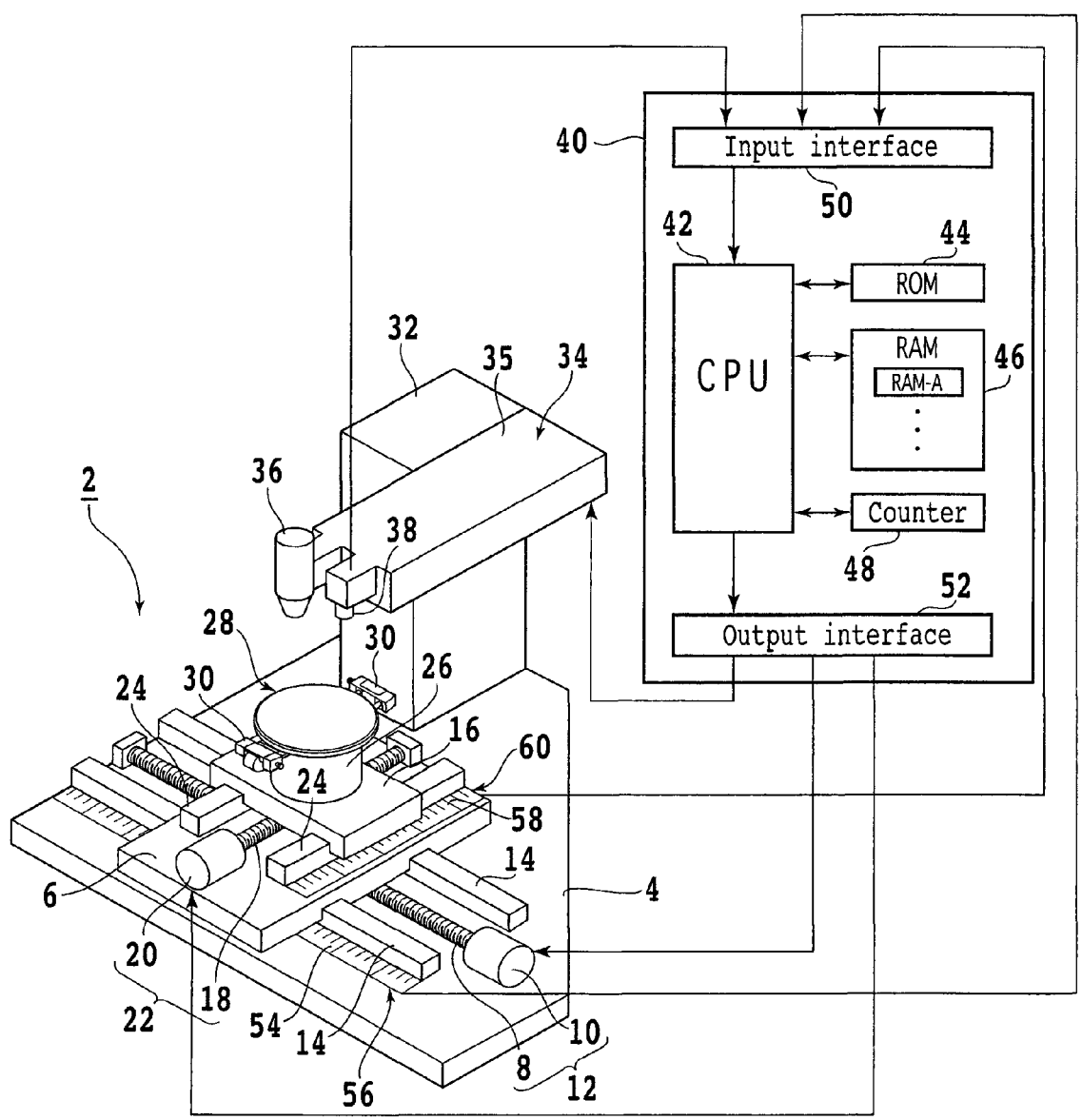
FIG. 1 is a schematic perspective view of a laser processing apparatus for performing a laser beam applying step in the wafer dividing method according to the present invention.

A preferred embodiment of the present invention will now be described in detail with reference to the drawings. FIG. 1 is a schematic perspective view of a laser processing apparatus 2 for performing the wafer dividing method according to the present invention. The laser processing apparatus 2 includes a stationary base 4 and a first slide block 6 supported to the stationary base 4 so as to be movable in the X direction shown by an arrow X. The first slide block 6 is movable in a feeding direction, i.e., in the X direction along a pair of guide rails 14 by feeding means 12 including a ball screw 8 and a pulse motor 10.

A second slide block 16 is supported to the first slide block 6 so as to be movable in the Y direction shown by an arrow Y. The second slide block 16 is movable in an indexing direction, i.e., in the Y direction along a pair of guide rails 24 by indexing means 22 including a ball screw 18 and a pulse motor 20. A chuck table 28 is supported through a cylindrical support member 26 to the second slide block 16. Accordingly, the chuck table 28 is movable both in the X direction and in the Y direction by the feeding means 12 and the indexing means 22. The chuck table 28 is provided with a pair of clamps 30 for clamping a semiconductor wafer 11 (see FIG. 2) held on the chuck table 28 under suction.

Figure 2:
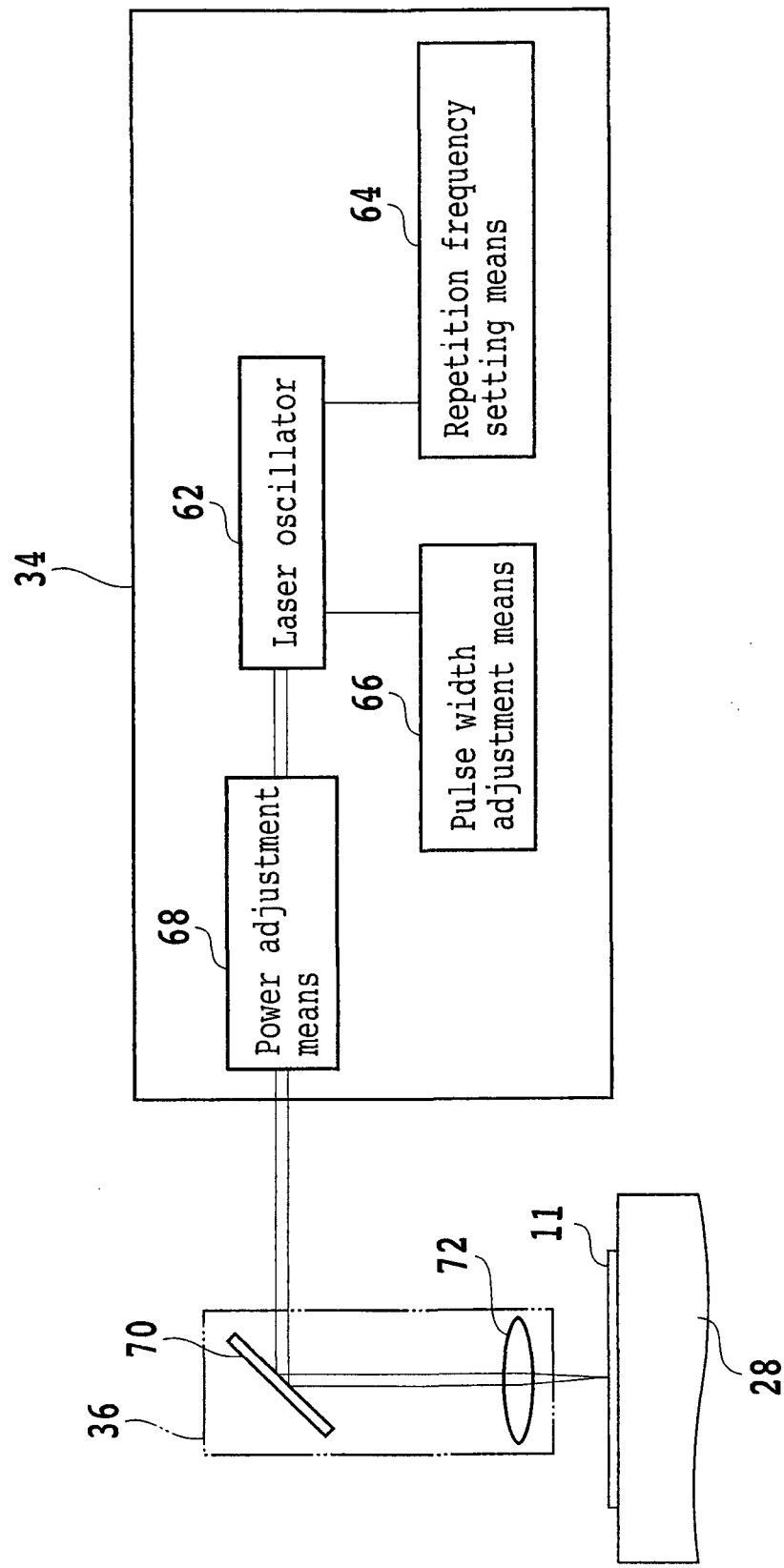
FIG. 2 is a block diagram of a laser beam applying unit.

A column 32 is provided on the stationary base 4, and a casing 35 for accommodating a laser beam applying unit 34 is mounted on the column 32. As shown in FIG. 2, the laser beam applying unit 34 includes a laser oscillator 62 such as a YAG laser oscillator or a YVO4 laser oscillator, repetition frequency setting means 64, pulse width adjusting means 66, and power adjusting means 68. A pulsed laser beam is generated by the laser oscillator 62, and the power of the pulsed laser beam is adjusted by the power adjusting means 68 of the laser beam applying unit 34. Focusing means 36 is mounted at the front end of the casing 35 and includes a mirror 70 and a focusing objective lens 72. The pulsed laser beam from the laser beam applying unit 34 is reflected by the mirror 70 and next focused by the objective lens 72 in the focusing means 36 so as to form a laser beam spot inside the semiconductor wafer 11 held on the chuck table 28.

Referring back to FIG. 1, imaging means 38 for detecting a processing area of the semiconductor wafer 11 to be laser-processed is also provided at the front end of the casing 35 so as to be juxtaposed to the focusing means 36 in the X direction. The imaging means 38 includes an ordinary imaging device such as a CCD for imaging the processing area of the semiconductor wafer 11 by using visible light. The imaging means 38 further includes infrared imaging means composed of infrared light applying means for applying infrared light to the semiconductor wafer 11, an optical system for capturing the infrared light applied to the semiconductor wafer 11 by the infrared light applying means, and an infrared imaging device such as an infrared CCD for outputting an electrical signal corresponding to the infrared light captured by the optical system. An image signal output from the imaging means 38 is transmitted to a controller (control means) 40.

The controller 40 is configured by a computer, and it includes a central processing unit (CPU) 42 for performing operational processing according to a control program, a read only memory (ROM) 44 preliminarily storing the control program, a random access memory (RAM) 46 for storing the results of computation, etc., a counter 48, an input interface 50, and an output interface 52.

Reference numeral 56 denotes feed amount detecting means including a linear scale 54 provided along one of the guide rails 14 and a read head (not shown) provided on the first slide block 6. A detection signal from the feed amount detecting means 56 is input into the input interface 50 of the controller 40. Reference numeral 60 denotes index amount detecting means including a linear scale 58 provided along one of the guide rails 24 and a read head (not shown) provided on the second slide block 16. A detection signal from the index amount detecting means 60 is input into the input interface 50 of the controller 40. An image signal from the imaging means 38 is also input into the input interface 50 of the controller 40. On the other hand, control signals are output from the output interface 52 of the controller 40 to the pulse motor 10, the pulse motor 20, and the laser beam applying unit 34.

Figure 3:
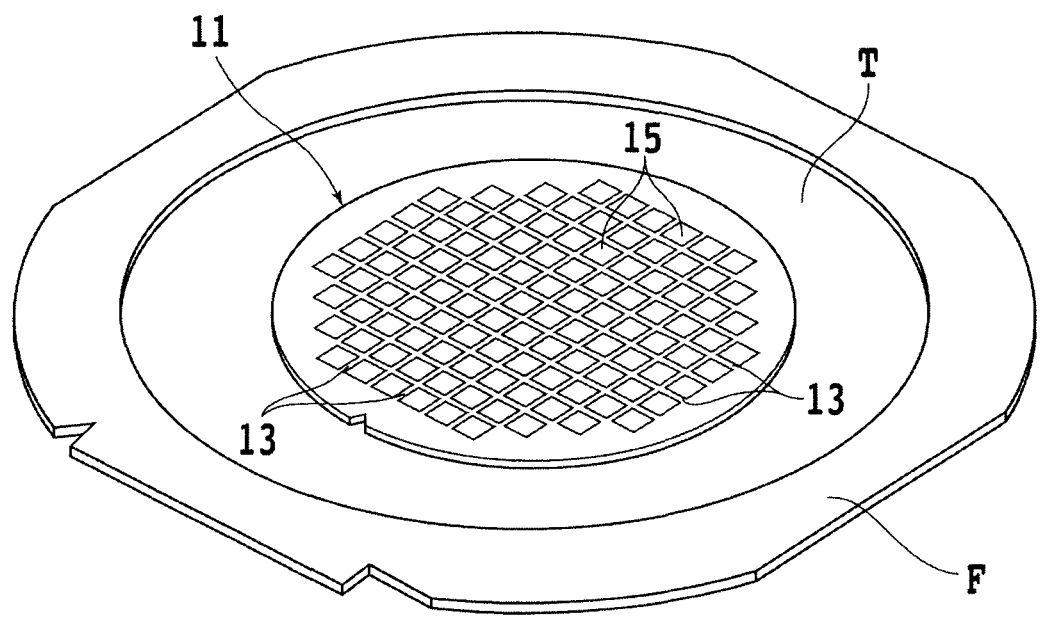
FIG. 3 is a perspective view for illustrating an adhesive tape attaching step in the wafer dividing method according to the present invention.

FIG. 3 is a perspective view of a semiconductor wafer 11 as an object to be processed by the laser processing apparatus 2 in the condition where the wafer 11 is attached to an adhesive tape T supported to an annular frame F. A plurality of crossing division lines 13 are formed on the front side of the wafer 11 to thereby partition a plurality of rectangular regions where a plurality of devices 15 are respectively formed. Preferably, prior to performing the laser processing by the laser processing apparatus 2, the wafer 11 is attached to the adhesive tape T whose peripheral portion is preliminarily attached to the annular frame F (adhesive tape attaching step). Accordingly, the wafer 11 is supported through the adhesive tape T to the annular frame F. The wafer 11 is held through the adhesive tape T on the chuck table 28 under suction, and the annular frame F is fixed by the clamps 30 shown in FIG. 1. Thus, the wafer 11 supported through the adhesive tape T to the annular frame F is fixedly held on the chuck table 28. As shown in an enlarged part of FIG. 5, the adhesive tape T is composed of a base sheet 17 and an adhesive layer 19 formed on the base sheet 17. The adhesive layer 19 is softened by heating. The base sheet 17 is formed of resin such as polyolefin, and the adhesive layer 19 is formed of acrylic resin.

In operation, the chuck table 28 holding the wafer 11 under suction is moved to a position directly below the imaging means 38. In the condition where the chuck table 28 is positioned directly below the imaging means 38, an alignment operation is performed in such a manner that the processing area of the wafer 11 to be laser-processed is detected by the imaging means 38 to make the alignment of the division lines 13 extending in a first direction on the wafer 11 and the focusing means 36 in the X direction. Thereafter, the chuck table 28 is rotated 90° to similarly perform the alignment operation for the other division lines 13 extending in a second direction perpendicular to the first direction mentioned above. Data on this alignment operation is stored into the RAM 46 of the controller 40.

Figure 4:
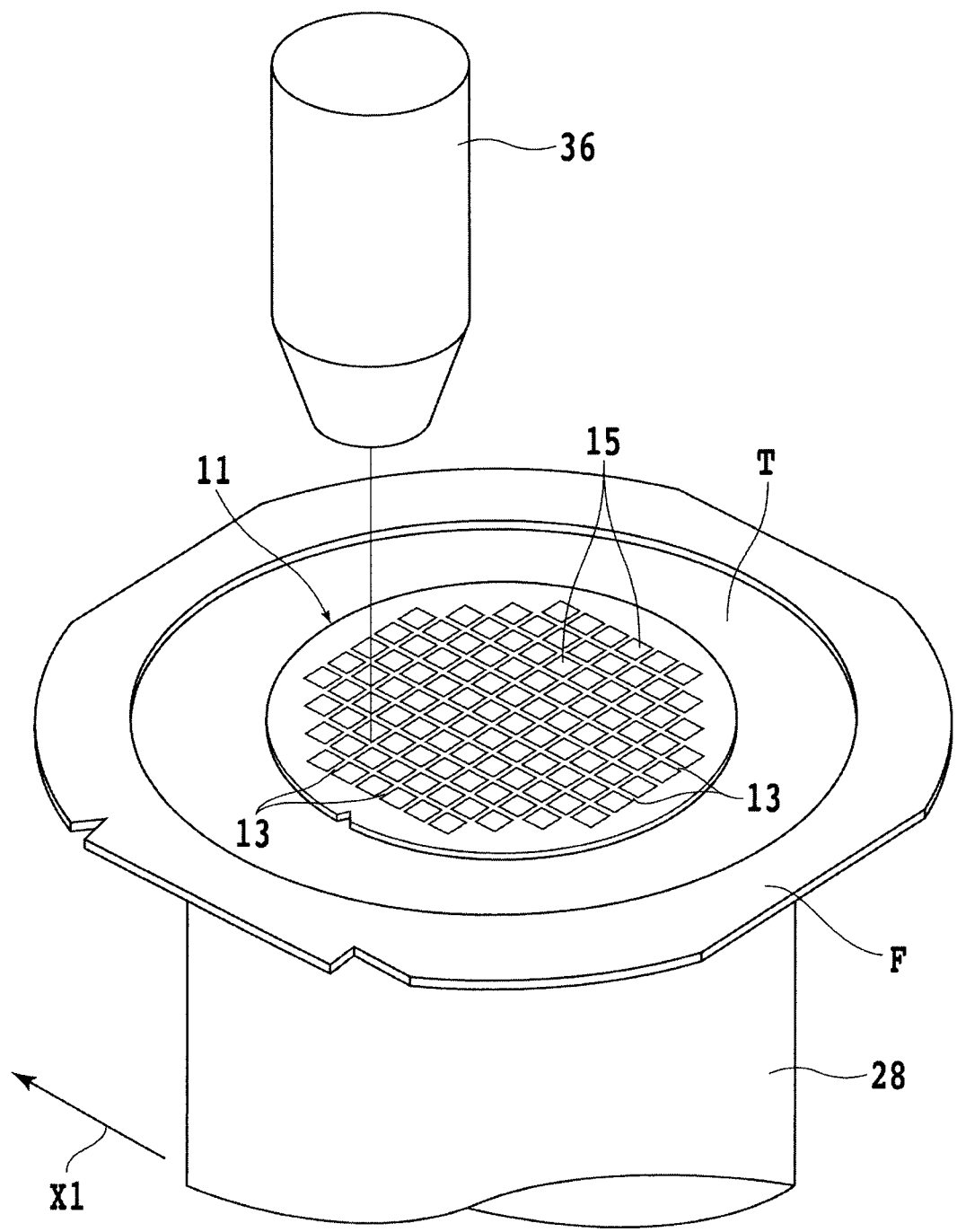
FIG. 4 is a perspective view for illustrating the laser beam applying step.
Figure 5:
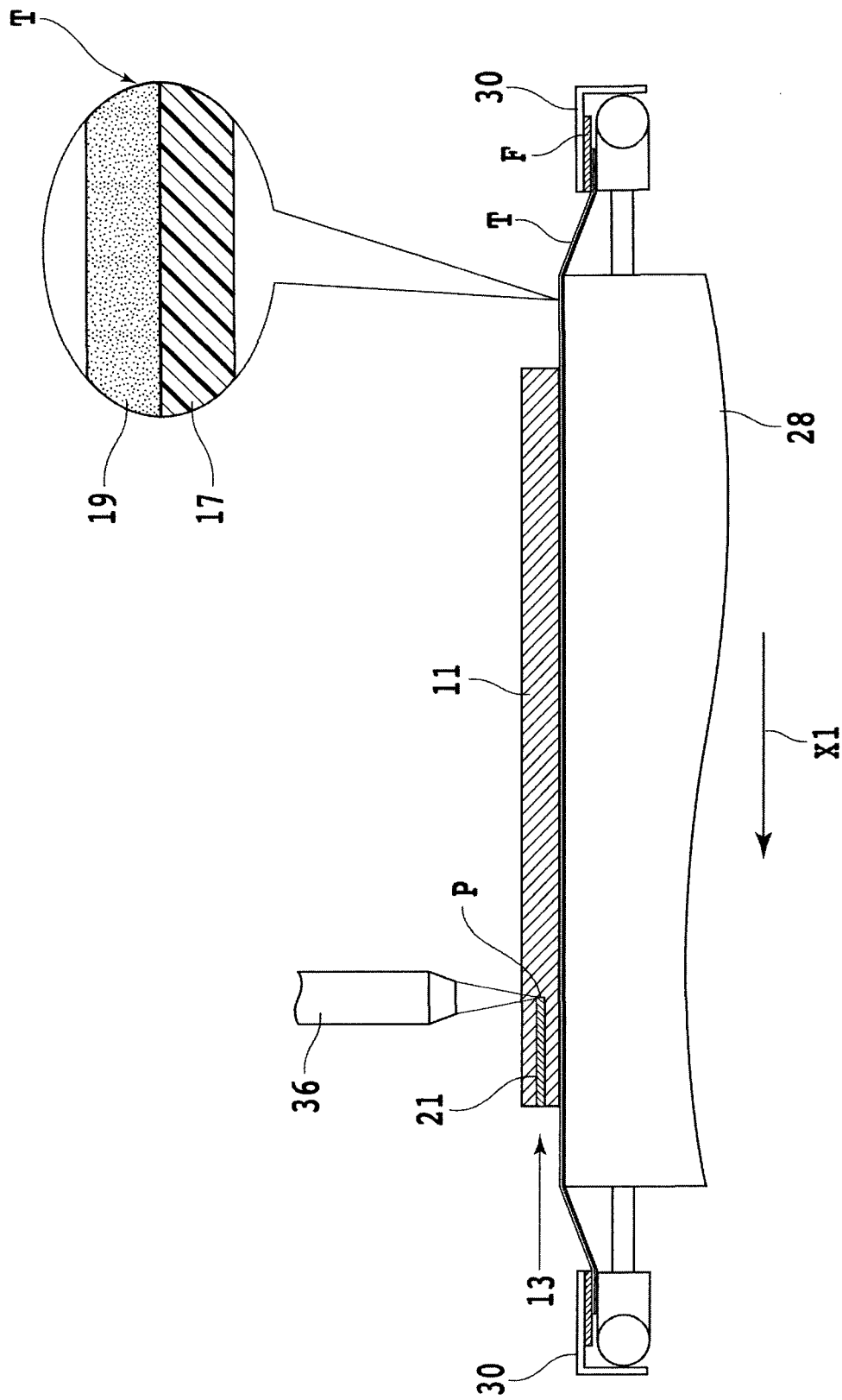
FIG. 5 is a partially sectional side view for illustrating the laser beam applying step.

After performing the alignment operation, a laser beam applying step is performed to form a modified layer inside the wafer 11 along each division line 13. As shown in FIGS. 4 and 5, the laser beam applying step is performed in such a manner that a laser beam having a transmission wavelength to the wafer 11 is applied from the focusing means 36 to the wafer 11 in the condition where the focal point P (see FIG. 5) of the laser beam is set inside the wafer 11 in an area corresponding to a predetermined one of the division lines 13 extending in the first direction. Simultaneously, the chuck table 28 is moved in the feeding direction shown by an arrow X1 in FIGS. 4 and 5, thereby forming a modified layer 21 inside the wafer 11 along this predetermined division line 13. Thereafter, the chuck table 28 is moved in the indexing direction (Y direction) by a given pitch, and the above laser processing is similarly performed along the other division lines 13 extending in the first direction to thereby form a plurality of modified layers 21 inside the wafer 11 along these division lines 13 extending in the first direction. Thereafter, the chuck table 28 is rotated 90° to similarly form a plurality of modified layers 21 inside the wafer 11 along all of the division lines 13 extending in the second direction.

Each modified layer 21 means a region different from its ambient region in density, refractive index, mechanical strength, or any other physical properties in the wafer 11 due to the application of the laser beam. Each modified layer 21 is formed as a melted and rehardened layer, for example. The laser beam applying step mentioned above is performed under the following processing conditions, for example.

Light source: LD pumped Q-switched Nd:YVO4 pulsed laser
  Wavelength: 1064 nm
  Repetition frequency: 100 kHz
  Pulse power: 10 μJ
  Focused spot diameter: φ1 μm
  Feed speed: 100 mm/sec While the adhesive tape attaching step of attaching the adhesive tape T to the wafer 11 is performed before performing the laser beam applying step in this preferred embodiment, the adhesive tape attaching step may be performed after performing the laser beam applying step. In this case, the wafer 11 is directly held under suction on the chuck table 28 in the laser beam applying step. After performing the laser beam applying step to form the modified layers 21 inside the wafer 11 along all of the division lines 13, the adhesive tape attaching step is performed to attach the wafer 11 having the modified layers 21 to the adhesive tape T supported to the annular frame F as shown in FIG. 3.

Figure 6:
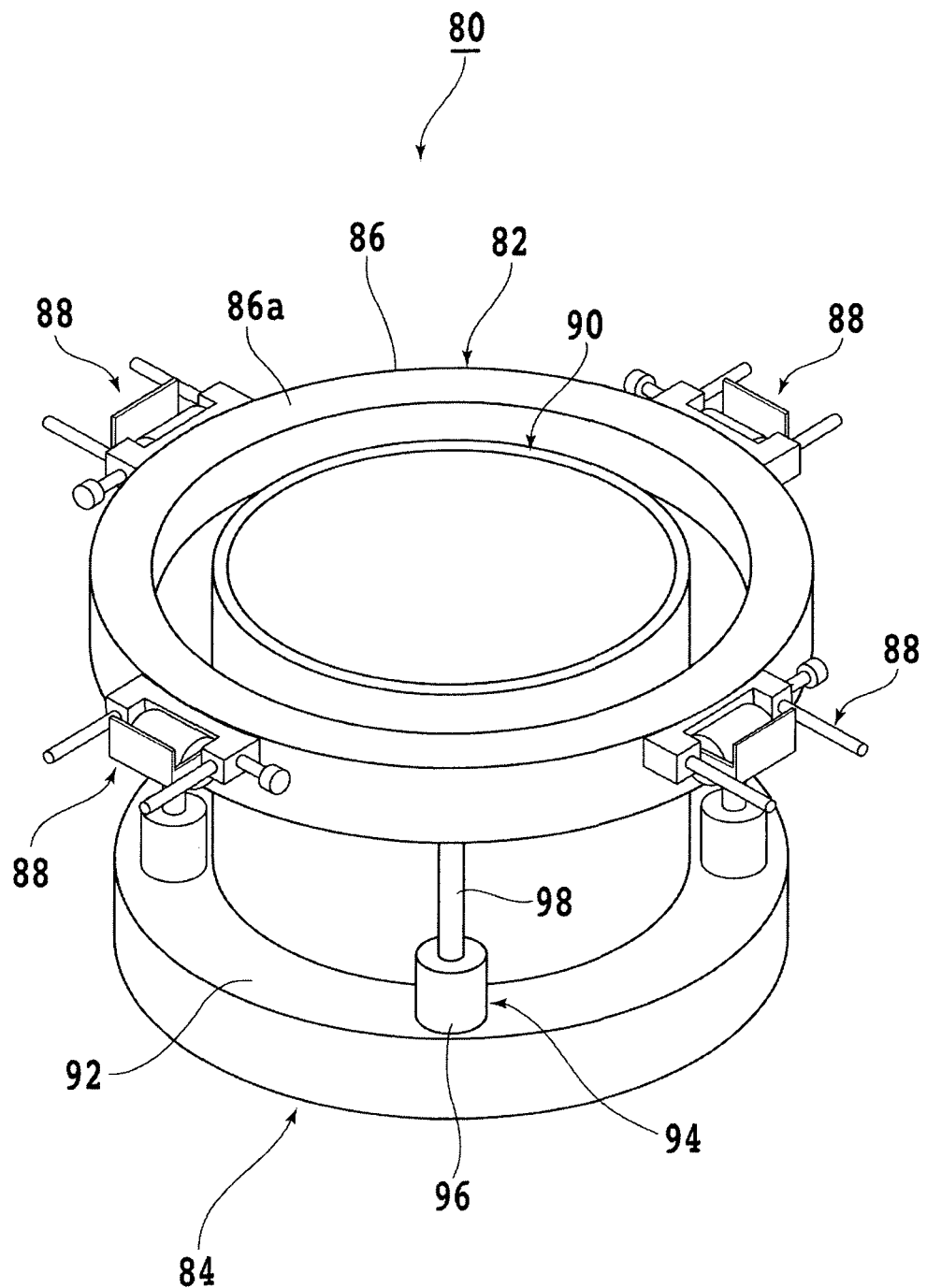
FIG. 6 is a perspective view of an expanding apparatus for performing a dividing step in the wafer dividing method according to the present invention.

After performing the laser beam applying step and the adhesive tape attaching step, a dividing step is performed by using an expanding apparatus (dividing apparatus) 80 shown in FIG. 6 to divide the wafer 11 into individual device chips along the division lines 13 where the modified layers 21 are formed. The expanding apparatus 80 shown in FIG. 6 includes frame holding means 82 for holding the annular frame F and tape expanding means 84 for expanding the adhesive tape T supported to the annular frame F held by the frame holding means 82.

The frame holding means 82 includes an annular frame holding member 86 and a plurality of clamps 88 as fixing means provided on the outer circumference of the frame holding member 86. The upper surface of the frame holding member 86 functions as a mounting surface 86a for mounting the annular frame F thereon. The annular frame F mounted on the mounting surface 86a is fixed to the frame holding member 86 by the clamps 88. The frame holding means 82 is supported by the tape expanding means 84 so as to be vertically movable.

The tape expanding means 84 includes an expanding drum 90 provided inside of the annular frame holding member 86. The expanding drum 90 has an outer diameter smaller than the inner diameter of the annular frame F and an inner diameter larger than the outer diameter of the wafer 11 attached to the adhesive tape T supported to the annular frame F. The expanding drum 90 has a supporting flange 92 integrally formed at the lower end of the drum 90. The tape expanding means 84 further includes driving means 94 for vertically moving the annular frame holding member 86. The driving means 94 is composed of a plurality of air cylinders 96 provided on the supporting flange 92. Each air cylinder 96 is provided with a piston rod 98 connected to the lower surface of the frame holding member 86.

Figure 7A:
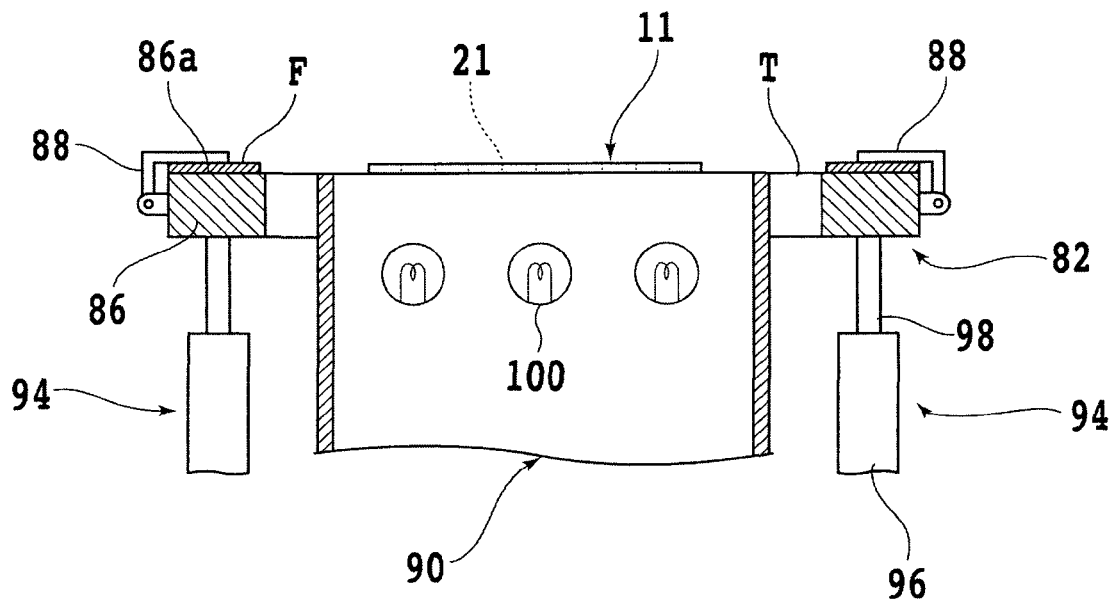
FIGS. 7A and 7B are sectional side views for illustrating the dividing step.
Figure 7B:
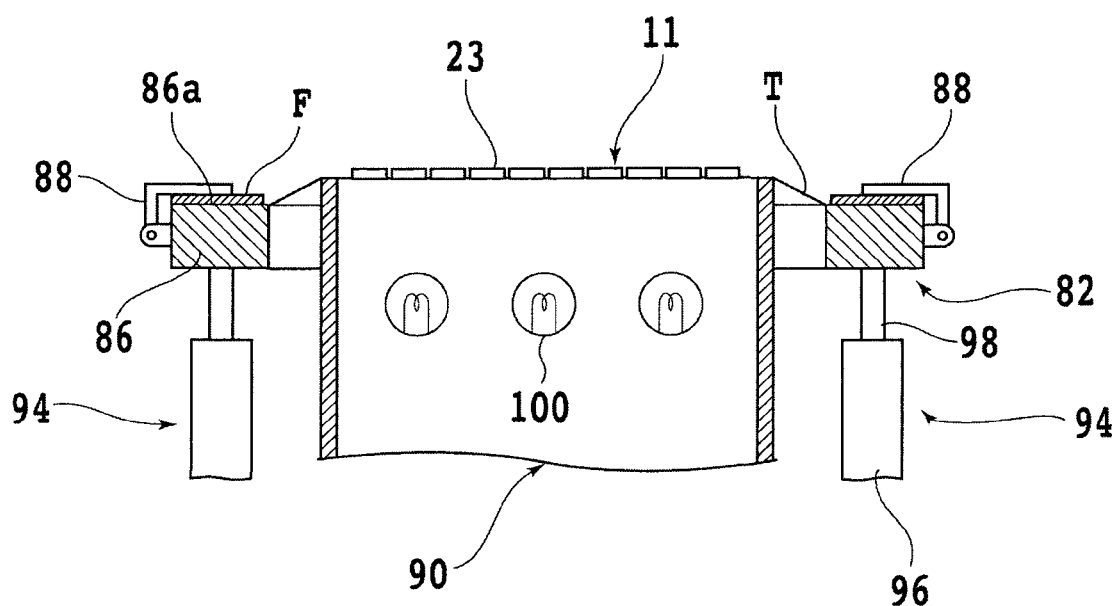

The driving means 94 composed of the plural air cylinders 96 functions to vertically move the annular frame holding member 86 so as to selectively take a reference position where the mounting surface 86a is substantially equal in height to the upper end of the expanding drum 90 and an expansion position where the mounting surface 86a is lower in height than the upper end of the expanding drum 90 by a predetermined amount. As shown in FIGS. 7A and 7B, a plurality of heater lamps 100 for heating the adhesive tape T are provided inside the expanding drum 90.

The dividing step using the expanding apparatus 80 will now be described with reference to FIGS. 7A and 7B. As shown in FIG. 7A, the annular frame F supporting the wafer 11 through the adhesive tape T is mounted on the mounting surface 86a of the frame holding member 86 and fixed to the frame holding member 86 by the clamps 88. At this time, the frame holding member 86 is set at the reference position where the height of the mounting surface 86a is substantially the same as that of the upper end of the expanding drum 90. Thereafter, the air cylinders 96 are driven to lower the frame holding member 86 to the expansion position shown in FIG. 7B. Accordingly, the annular frame F fixed to the mounting surface 86a of the frame holding member 86 is also lowered, so that the adhesive tape T supported to the annular frame F comes into abutment against the upper end of the expanding drum 90 and is expanded mainly in the radial direction of the expanding drum 90 as shown in FIG. 7B.

As a result, a tensile force is radially applied to the wafer 11 attached to the adhesive tape T. When a tensile force is radially applied to the wafer 11, the wafer 11 is broken along the modified layers 21 as a break start point formed along the division lines 13 because the strength of each modified layer 21 is low, thereby dividing the wafer 11 into the individual device chips 23.

Figure 8:
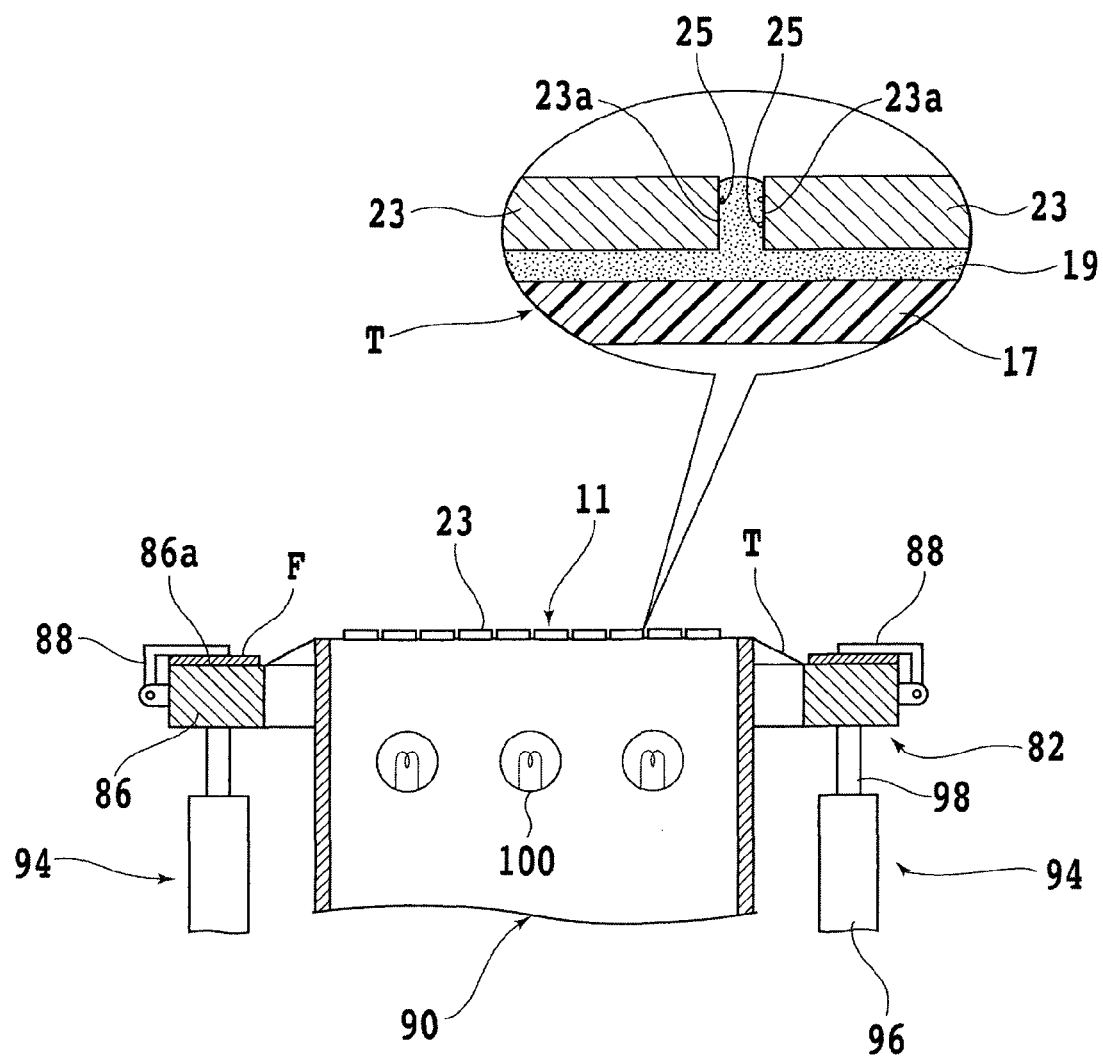
FIG. 8 is a sectional side view for illustrating a debris catching step in the wafer dividing method according to the present invention.

After performing the dividing step to divide the wafer 11 into the individual device chips 23, a debris catching step is performed to catch debris generated on the side surface of each device chip 23 in dividing the wafer 11 along the division lines 13 where the modified layers 21 as a division start point are formed. As shown in FIG. 8, the debris catching step is performed in such a manner that the adhesive tape T is heated by the heater lamps 100 to thereby soften the adhesive layer 19 of the adhesive tape T and make the softened adhesive layer 19 enter the space between any adjacent ones of the device chips 23. As a result, debris 25 generated on the side surface 23a of each device chip 23 are caught by the adhesive layer 19 by adhesion.

After performing this debris catching step, each device chip 23 is picked up by using a pickup apparatus (not shown). At this time, the debris 25 are removed from the side surface 23a of each device chip 23 because the debris 25 are caught by the adhesive layer 19. This debris catching step may be performed simultaneously with the dividing step shown in FIG. 7B. Further, while the heater lamps 100 are used as heating means for heating the adhesive tape T in this preferred embodiment, the heater lamps 100 are not limitative, and any other heating means such as hot air may be adopted.

While the dividing method of the present invention is applied to the semiconductor wafer 11 in this preferred embodiment, the workpiece to be processed by the present invention is not limited to the semiconductor wafer 11, but the present invention is applicable also to any other wafers such as a sapphire wafer and an SiC wafer.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method for dividing a wafer along a plurality of crossing division lines to obtain a plurality of device chips, said division lines being formed on the front side of said wafer to thereby partition a plurality of regions where a plurality of devices are respectively formed, said wafer dividing method comprising:

a laser beam applying step of applying a laser beam having a transmission wavelength to said wafer along said division lines in a condition where the focal point of said laser beam is set inside said wafer, thereby forming a plurality of modified layers inside said wafer along said division lines;

an adhesive tape attaching step of attaching an adhesive tape to said wafer before or after performing said laser beam applying step, said adhesive tape having a base sheet and an adhesive layer formed on said base sheet, said adhesive layer being softened by heating;

a dividing step of applying an external force to said wafer by expanding said adhesive tape after performing said laser beam applying step and said adhesive tape attaching step, thereby dividing said wafer along said division lines to obtain said plurality of device chips; and a debris catching step of heating said adhesive tape to thereby soften said adhesive layer of said adhesive tape and make said softened adhesive layer enter the space between any adjacent ones of said device chips obtained by said dividing step, thereby catching debris generated in said dividing step to said adhesive layer by adhesion.

2. The wafer dividing method according to claim 1, wherein said dividing step and said debris catching step are performed simultaneously.

* * * * *